United States Patent
Tsai et al.

(10) Patent No.: US 6,566,805 B1
(45) Date of Patent: May 20, 2003

(54) ORGANIC ELECTRO-LUMINESCENT DEVICE WITH FIRST AND SECOND COMPOSITE LAYERS

(75) Inventors: Rung-Ywan Tsai, Taoyuan Hsien (TW); Ching-Ian Chao, Hsinchu Hsien (TW); Chia-Shy Chang, Hsinchu (TW); Mu-Yi Hua, Miaoli Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 253 days.

(21) Appl. No.: 09/672,920

(22) Filed: Sep. 28, 2000

(30) Foreign Application Priority Data

Jun. 1, 2000 (TW) ........................... 89110673 A

(51) Int. Cl.$^7$ ............................... H01J 1/62; H01J 63/04
(52) U.S. Cl. ....................... 313/504; 313/506; 313/509; 428/690
(58) Field of Search ................. 313/504, 503, 313/506, 509; 428/690

(56) References Cited

U.S. PATENT DOCUMENTS

| | | | |
|---|---|---|---|
| 4,885,211 A | 12/1989 | Tang et al. | 428/457 |
| 5,237,439 A | 8/1993 | Misono et al. | 349/122 |
| 5,245,457 A | 9/1993 | Fukuchi | 349/138 |
| 5,808,715 A | 9/1998 | Tsai et al. | 349/122 |
| 5,844,363 A | 12/1998 | Gu et al. | 313/506 |
| 5,909,081 A * | 6/1999 | Eida et al. | 313/504 |
| 6,228,514 B1 * | 5/2001 | Tadashi et al. | 313/504 |
| 6,235,414 B1 * | 5/2001 | Epstein et al. | 257/103 |

OTHER PUBLICATIONS

"The "Plastic" Led: A Flexible Lihgt–Emitting Device Using a Polyaniline Transparent Electrode", Synthetic Metals, 55–57 (1993), pp4123–27.

"Annealing effects on the properties of indium tin oxide films coated on soda glasses with a barrier layer of TiO2–SiO2 composite films", Opt. Eng. 36(8), p2335–40 (Aug. 1997).

"Influences of the deposition rate on the microstructure and hardness of composite films prepared by reactive ion–assisted coevaporation", Opt. Eng. 34(10) p3075–82 (Oct. 1995).

* cited by examiner

*Primary Examiner*—Vip Patel
*Assistant Examiner*—Kevin Quarterman
(74) *Attorney, Agent, or Firm*—J. C. Patents

(57) ABSTRACT

A flexible organic electro-luminescent device is provided, in which a titanium dioxide-silicon dioxide composite layer is formed on the upper and lower surfaces of a transparent plastic substrate. A transparent conductive electrode and an organic luminescent layer are formed in sequence on one of surfaces of the composite layer. The organic luminescent layer is either small molecule luminescent material or polymer luminescent material. Then, a metal electrode is formed on the organic luminescent layer, and a silicon dioxide protecting layer is formed on the metal electrode to enclose the metal electrode and the organic luminescent layer completely. The titanium dioxide-silicon dioxide composite layer and silicon dioxide protecting layer are formed by ion-assisted electron gun evaporation in the temperature lower than 100° C., which does not result in the thermal loading to the small molecule and polymer organic electro-luminescent device.

18 Claims, 4 Drawing Sheets

ORGANIC ELECTRO-LUMINESCENT DEVICE WITH FIRST AND SECOND COMPOSITE LAYERS

CROSS-REFERENCE TO RELATED APPLICATION

This application claims the priority benefit of Taiwan application serial no. 89110673, filed Jun. 1, 2000.

BACKGROUND OF THE INVENTION

1. Field of Invention

The present invention relates to an organic electro-luminescent device (OEL) and, especially to a flexible organic electro-luminescent device and the process thereof.

2. Description of Related Art

The organic electro-luminescent material has characteristics such as self-emitting, broad range of visual angle (0–160°), high response speed, low driving voltage, and full colors. It has been put into practice as a color plane display panel, such as a compact display panel, an out-door display billboard, a computer, and a television monitor. The organic electro-luminescent material has been developed since 1960. The organic electro-luminescent material usually is used to form a light emitting layer (EML). The light emitting layer incorporates between a metal electrode and a transparent anode, such that an organic electro-luminescent display is formed.

The organic electro-luminescent devices are divided into two groups according to the type of material used: one is a small molecule organic electro-luminescent device and a polymer organic electro-luminescent device. In the early 1980s, U.S.A. Eastman Kodak utilized tri-(8-hydroxyquinoline) aluminium ($Alq_3$) to form an organic emitting layer and inserts a hole injecting layer between the emitting layer and the anode. This manner greatly improves the characteristics and stability of the organic electro-luminescent device, and launches the application of the organic electro-luminescent device. In 1990, Cambridge University of England utilized poly p-phenylene vinylene (PPV) conjugated polymer to fabricate a polymer organic electro-luminescent device. Since the materials of ploy(p-phenylene vinylene (PPV) type have the characteristics similar to semiconductors and the easy fabrication process for the polymer organic electro-luminescent devices, it highly interests people to make intensive researches again.

Since plastic has properties of transparency, light weight, flexibility, proper stretching strength and brittle resistance, plastic can be used as a substrate for a liquid crystal display (LCD) that is portable, thin and light. For example, the plastic substrate disclosed in U.S. Pat. Nos. 5,237,439 and 5,245,457 by Sharp Co. Ltd., Japan. The plastic substrate can also be used as substrates for the organic electro-luminescent devices (for example, U.S. Pat. No. 5,844,363 assigned to Princeton University, USA). The plastic substrates can be also applied in other optical display devices.

The material used for the plastic substrate is usually acrylic resin, epoxy resin, polyethylene terephthalate (PET), or polycarbonate (PC). However, the above materials used for the plastic substrate can not endure high temperature. Therefore, in such processes for producing liquid crystal displays and organic electro-luminescent devices, the temperature can not exceed 200° C. when a transparent conductive electrode of indium tin oxide (ITO) is formed on the plastic substrate. A surface treatment of hard coating is also necessary to be performed to prevent the plastic substrate from being scraped, since the plastic material usually is soft.

Further, the plastic substrate can not effectively prevent water and oxygen from entering because of its low packing density, which also causes the absorption of water and oxygen. However, the organic film formed in the organic electro-luminescent device is very sensitive to the water and oxygen, so that the organic film would be damaged by the water and oxygen, which results in a decrease in the lifetime of the organic electro-luminescent device. Moreover, the water and oxygen contained in the plastic material are often released during vacuum deposition, causing that the evaporated layer has poor adhesion. Also, the water and oxygen are gradually released after the device is accomplished, resulting in deterioration of performance for the conductive electrode and luminescent material of the organic electro-luminescent device. The foregoing factors may cause poor performance and low stability of the plastic organic electro-luminescent device.

Referring to FIG. 1, a schematic view of the structure of the plastic organic electro-luminescent device in the art is shown. Such structure is disclosed in U.S. Pat. No. 4,885,211. The structure is fabricated by coating a transparent conductive electrode 102 on a substrate 100, where the transparent conductive electrode 102 serves as a hole injection layer. The conductive electrode 102 is formed of indium tin oxide, with the thickness of 30 nm to 400 nm and an area resistance of smaller than 100 $\Omega/cm^2$. Further, an organic emitting layer 104 is coated on the transparent electrode 102. Then, a metal conductive electrode 106 having a low work function, serving as an electron injection layer (EIL) is coated on the surface of the organic emitting layer 104. The material used for the metal conductive electrode 106 comprises Li, Mg, Ca, Al, Ag, In, or alloys thereof. The metal conductive electrode 106 has a thickness of 100 nm to 400 nm.

The organic electro-luminescent devices are generally divided into two types of a small molecule organic electro-luminescent device and a polymer organic electro-luminescent device according to the organic material used in the organic electro-luminescent device. The methods for coating the emitting layer of the organic electro-luminescent device can also be different.

The small molecule organic electro-luminescent layer usually has a two-layer structure, as described in U.S. Pat. No. 5,844,363 proposed by Princeton University, USA. A hole transport layer (HTL) having the thickness such as 80 nm and an emitting layer having the thickness of such as 80 nm are formed in sequence on the indium tin oxide layer by vacuum deposition. The material used for the hole transport layer comprises N,N'-dipheny-N,N'-(m-tolyl)benzidine (TPD). The material used for the emitting layer comprises tri-(8-hydroxyquinoline)aluminum ($Alq_3$).

The polymer organic electro-luminescent layer usually has a single-layer structure, as described in the Synthetic Metals, 55–57, 4123–4127 (1993) published by G. Gustafsson et al. In such structure, a poly(2-methoxy-5-(2'-ethyl-hexyloxy)p-phenylene-vinylene (MEH-PPV) having a thickness of 50 nm to 100 nm is used as the emitting layer. In the polymer organic electro-luminescent device, the transparent conductive electrode is an indium tin oxide layer or a polyaniline (PANI) layer with camphor sulfonic acid (CSA) formed by spin coating, dipping, spray coating, doctor knife, screen printing, or inkjet printing.

However, either in the small molecule organic electro-luminescent device or the polymer organic electro-luminescent device, the organic electro-luminescent layer (for example, 104 in FIG. 1) and metal electrode (for example, 106 in FIG. 1) in these devices are very sensitive to water and oxygen. This results in a reaction with water and oxygen, such that these devices are damaged in the atmosphere that contains even a little amount of water and oxygen. Therefore, in the process for producing the organic electro-luminescent device, the demand for controlling the content of the water and oxygen in the atmosphere is strict, i.e. the required content of the water and oxygen therein is no more than 1 ppm. Further, U.S. Pat. No. 5,844,363 discloses a flexible small molecule organic electro-luminescent device formed by vacuum deposition, but it still failed to provide a solution to effectively prevent the water and oxygen from being released from the plastic substrate. Also, in the research published by G. Gustafsson et al., the flexible polymer organic electro-luminescent device is formed by spin coating, without any treatment for the plastic substrate.

For the plastic thin film liquid crystal display, the water and oxygen released or penetrated from the plastic substrate are necessarily to be avoided, so as to protect the plastic substrate. Also, the thermal stress between the plastic substrate and the indium tin oxide electrode is necessary to be reduced to prevent the layers from being cracked. Therefore, a protecting film layer must be coated between the indium tin oxide layer and the plastic substrate.

In U.S. Pat. No. 5,237,439, a hard coating layer having the thickness of 2 $\mu$m to 6 $\mu$m is formed by dipping and baking on both surfaces of the plastic substrate which has a thickness of 0.1 mm to 0.5 mm. The material used for forming the hard coating layer comprises organosilane, acrylic acid, melamine, and urethane, all of which are doped with boron. Such a hard coating layer can protect the plastic substrate and absorb the water released from the plastic substrate. The hard coating layer can also buffer thermal stress existing between the undercoat of SiOx with 10 nm to 60 nm in thickness, and the indium tin oxide electrode, so that cracks in the indium tin oxide layer can be avoided. Moreover, a TiOx buffer layer can also be formed between the organic hard coating layer without boron doping and the undercoat of SiOx to achieve the same properties with that of the boron-doped organic hard layer. The above TiOx buffer layer, SiOx undercoat and ITO electrode all are formed by sputtering deposition.

In U.S. Pat. No. 5,245,457, a method of forming topcoat in low temperature is provided. In such method, the commercially available silica-containing oil for coating is applied over the surface of the indium tin oxide electrode on the plastic substrate. After exposure to the radiation of UV light, a low temperature treatment is carried out in the temperature lower than 200° C. to form a topcoat and prevent the plastic substrate from being damaged.

In U.S. Pat. No. 5,808,715, a titanium dioxide-silicon dioxide composite layer is provided to serve as the topcoat and undercoat of the liquid crystal display device, in which the titanium dioxide-silicon dioxide composite layer is formed as the topcoat and undercoat for the transparent electrode of the plastic thin film liquid crystal display by ion-assisted electron gun evaporation under a temperature lower than 100° C. Such a titanium dioxide-silicon dioxide composite layer has superior insulating property, considerable hardness, and smooth surfaces. It has the following advantages: (1) preventing shortage between electrodes caused by conductive impurities having the same size as or larger than the gap between electrodes; (2) protecting plastic substrate from being scraped; (3) serving as a water and oxygen barrier layer; (4) serving as a bonding layer between the plastic substrate and indium tin oxide layer to prevent cracks of the layers caused by the difference in thermal expansion between indium tin oxide layer and the plastic substrate or by bending.

SUMMARY OF THE INVENTION

The present invention provides an organic electro-luminescent device and the process to fabricate the same. According to the present invention, a topcoat and undercoat are formed on the transparent conductive electrodes of the small molecule and/or polymer organic electro-luminescent device, respectively. The topcoat and the undercoat serve as the water and oxygen barrier layer and hard protecting layer for the transparent electrodes of the organic electo-luminescent device. The topcoat and the undercoat also serve as the protecting layer for the metal conductive electrode (i.e. electron injection layer) in the organic electro-luminescent device. The topcoat, undercoat and transparent conductive layer are designed to have the appropriate thickness ranges, so as to increase the luminescent efficiency of the organic electro-luminescent device.

According to the above and other objects of the present invention, a process for fabricating is provided, in which a transparent plastic substrate having a first surface and a second surface is provided. A first composite layer and a second composite layer are formed on the first and second surfaces of the transparent plastic substrate by low-temperature ion-assisted electron gun evaporation. A transparent electrode is formed on the first composite layer by low-temperature ion-assisted electron gun evaporation. An organic emitting layer of small molecule luminescent material is formed on the transparent electrode by thermal evaporation, or an organic emitting layer of polymer luminescent material is formed on the transparent electrode by spin coating. A metal electrode is formed on the organic emitting layer by thermal evaporation. Also and, a protecting layer is formed on the metal electrode by low-temperature ion-assisted electron gun evaporation to enclose the metal electrode and the organic emitting layer completely.

Further, according to the above and other objects, an organic electro-luminescent device is provided. The organic electro-luminescent device comprises a plastic substrate having a first surface and a second surface. A first composite layer and a second composite layer are formed on the first surface and the second surface of the plastic substrate, respectively. An indium tin oxide electrode is formed on the first composite layer. The first composite layer is located between the plastic substrate and the indium tin oxide electrode. An organic emitting layer of small molecule or polymer luminescent material is formed on the indium tin oxide electrode. A metal electrode is formed on the organic emitting layer so as to allow the organic emitting layer to be between the indium tin oxide electrode and the metal electrode. Additionally, a silicon dioxide protecting layer can be also applied on the metal electrode to enclose the metal electrode and the organic emitting layer completely.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENTS

Figure 1:
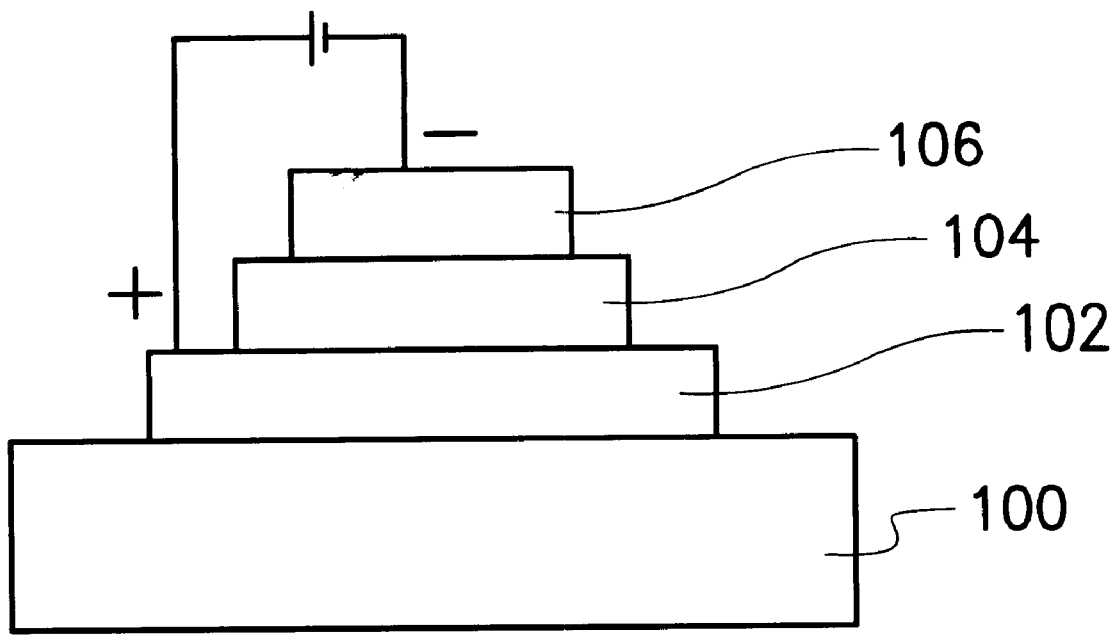
FIG. 1 is the schematic view of the structure of the plastic organic electro-luminescent device in the art.
Figure 2A:
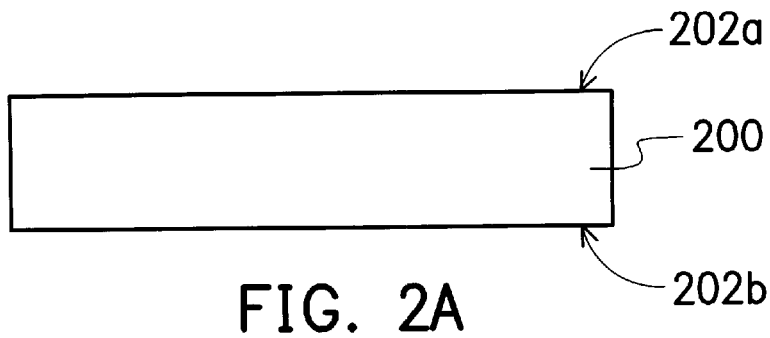
FIGS. 2A to 2F are the cross sectional view of the organic electro-luminescent device and the process thereof according to one of the preferred embodiments of the present invention.

Referring to FIGS. 2A to 2F, a method of fabricating an organic electro-luminescent device according to one of the preferable examples of the present invention is schematically illustrated. Such organic electro-luminescent device can include flexible organic electro-luminescent devices. As shown in FIG. 2A, a transparent substrate 200 for visible light having a first surface 202a and a second surface 202b is provided. The plastic substrate 200 used in the flexible plastic organic electro-luminescent device according to the present invention comprises polycarbonate (PC), acrylic-polymethyl methacrylate (Acrylic—PMMA), polyester resin, epoxy resin, or the like. The dimension thereof (length×width×thickness) is, for example, 2.5×2.5×0.1 (mm) or 2.5×2.5×0.25 (mm), with thickness smaller than or about equal to 0.25 mm.

Figure 2B:
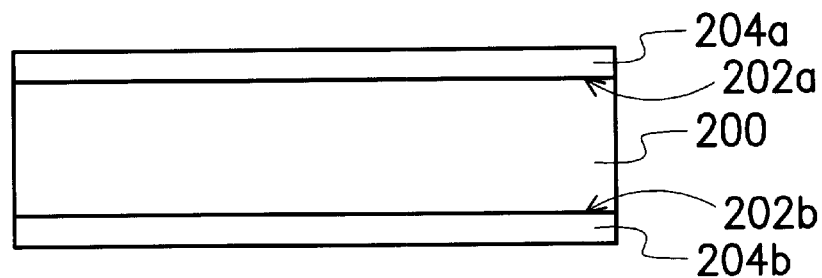

Referring to FIG. 2B, a composite layer 204a and a second composite layer 204b are formed on the first surface 202a and the second surface 202b of the transparent plastic substrate 200, respectively. The method of forming the first composite layer 204a and the second composite layer 204b includes ion-assisted electron gun evaporation. It is preferred that transparent plastic substrate 200 is put into the vacuum chamber (not shown in drawings) at the temperature lower than 100° C. to form an evaporated layer by ion-assisted electron gun evaporation. The first composite layer 204a and the second composite layer 204b include, for example, a titanium dioxide-silicon dioxide ($TiO_2$—$SiO_2$) composite layer.

As shown in FIG. 2B, the first composite layer 204a located on the first surface 202a of the transparent plastic substrate 200, with the titanium dioxide ($TiO_2$) content in a wide range of from 0% to 100% in atomic percentage. This means that the ratio of titanium dioxide to silicon dioxide in the first $TiO_2$—$SiO_2$ composite layer can be varied as intended. The first composite film 204a has the thickness of about 20 nm to about 150 nm. The first composite layer 204a not only serves to stop the water and oxygen released from the inside of the plastic substrate 200, but also to be used as a bonding layer for the indium tin oxide layer 206 and the plastic substrate 200.

In FIG. 2B, the second composite layer 204b located on the second surface 202b of the transparent plastic substrate 200 is similar to the first composite layer 204a. The content of titanium dioxide also ranges from 0% to 100%, i.e., the ratio of titanium dioxide to silicon dioxide in the titanium dioxide-silicon dioxide composite layer of the second composite layer 204b can be varied without restriction. The second composite layer 204b has the thickness of about 20 nm to 150 nm. It serves as a hard layer for protecting the transparent plastic substrate 200 from being scraped by an external force.

When the first composite layer 204a and the second composite layer 204b made with titanium dioxide-silicon dioxide composite layers are formed by ion-assisted electronic gun evaporation, the starting material for evaporation is $Ti_2O_3$ tablets and silicon dioxide particles. To control the composition of the titanium dioxide-silicon dioxide composite layer, the evaporation rate of titanium dioxide is set to be about 0.2 nm/s, and that of silicon dioxide is varied from 0 nm/s to about 2 nm/s. The gas used for reaction is a mixture of argon with high purity of, for example, more than 99.99% and oxygen ($O_2$) with high purity of, for example, more than 99.99%. The flow rate of the argon is about 18 ml/min (about 18 sccm). The flow rate of the oxygen is about 30 ml/min (about 30 sccm). The discharge voltage of the ion gun source is about 100 volts with a discharge current of about 40 A. Thus, the total energy of the ion source is about 90 eV. The evaporation process of the titanium dioxide-silicon dioxide composite layer is entailed with reference to the literature published for example by the present inventors (*Opt. Eng* 34, 3075–3982 (1995) and *Opt. Eng.* 36, 2335–2340 (1997)).

Figure 2C:
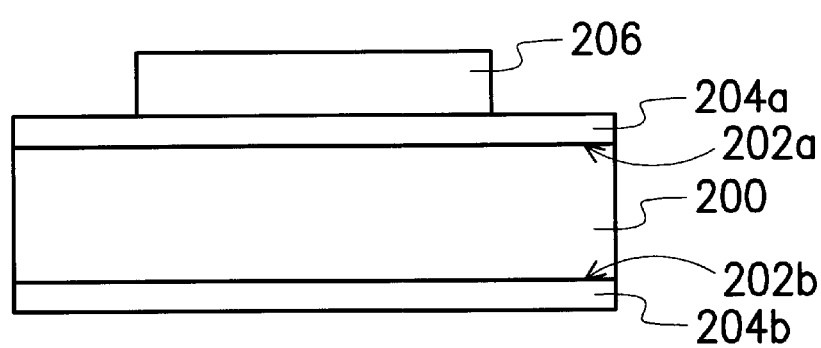

Referring to FIG. 2C, a transparent conductive electrode 206 is formed on the surface of the first composite layer 204a. The transparent conductive plastic electrode for the organic electro-luminescent device is then formed. The method for forming the transparent conductive layer 206 includes ion-assisted electronic gun evaporation in the same vacuum chamber in a substrate temperature of less than 100° C. The starting material for evaporating the transparent conductive layer 206 is indium tin oxide in the form of tablets, for example, in which the ratio of tin oxide ($SnO_2$) is 10% in weight (i.e. 90% $In_2O_3$-10%$SnO_2$). The transparent conductive electrode includes indium tin oxide has the thickness of 30 nm to 400 nm and an area resistance of less than 100 $\Omega/cm^2$. If a display is needed for the conductive plastic substrate, the electrode pattern required for forming the display can be formed on the transparent conductive layer, i.e. the transparent conductive electrode 206 having the defined pattern is formed.

Figure 2D:
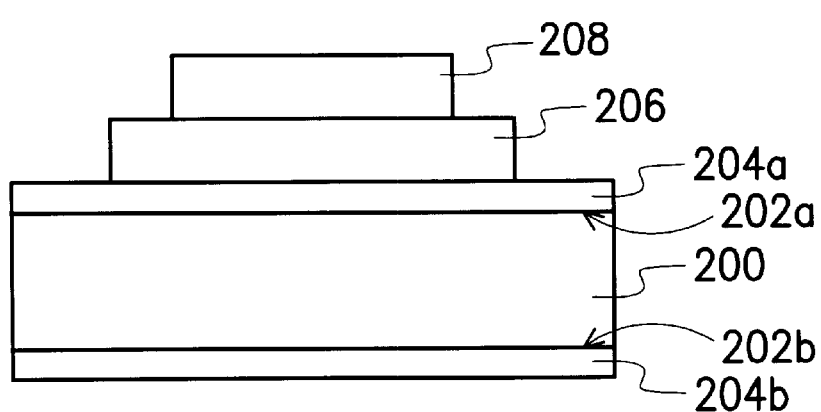

Referring to FIG. 2D, after the transparent conductive electrode 206 for the organic electro-luminescent device is completed, an electro-emitting layer (EML) 208 is formed on the transparent conductive electrode 206. The EML 208 is formed of such as single-layered luminescent material or multi-layered luminescent material. The EML 208 includes small molecule luminescent material and polymer luminescent material. If the material used for the EML 208 is small molecule, one or more layers of the small molecule luminescent material can be evaporated on the transparent conductive electrode 206 by thermal evaporation. If the EML 208 is formed of polymer luminescent material, one or more layers of the polymer luminescent material can be deposited on the transparent conductive electrode 206 by spin coating.

Figure 2E:
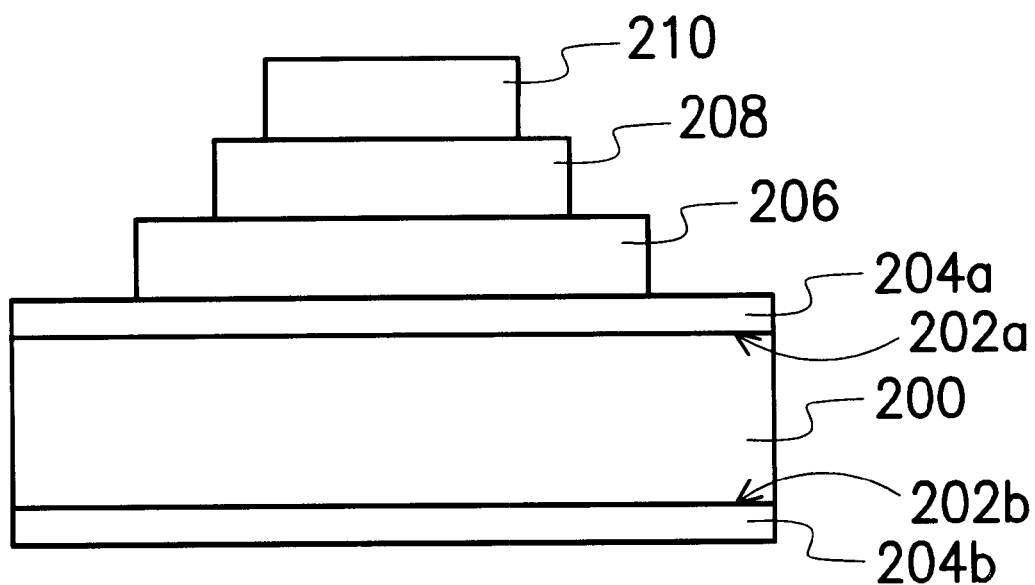

Referring to FIG. 2E, a metal conductive electrode 210 is formed on the EML 208 of the plastic substrate 200, serving as an electron injection layer (EIL). The method of forming the metal conductive electrode 210 includes thermal evaporation. The conductive electrode 210 is formed of such as single-layered metal material, or multi-layered metal material. The metal conductive electrode 210 includes lithium, magnesium, calcium, aluminum, silver, indium or the alloy thereof, having a thickness of about 100 nm to about 400 nm.

Figure 2F:
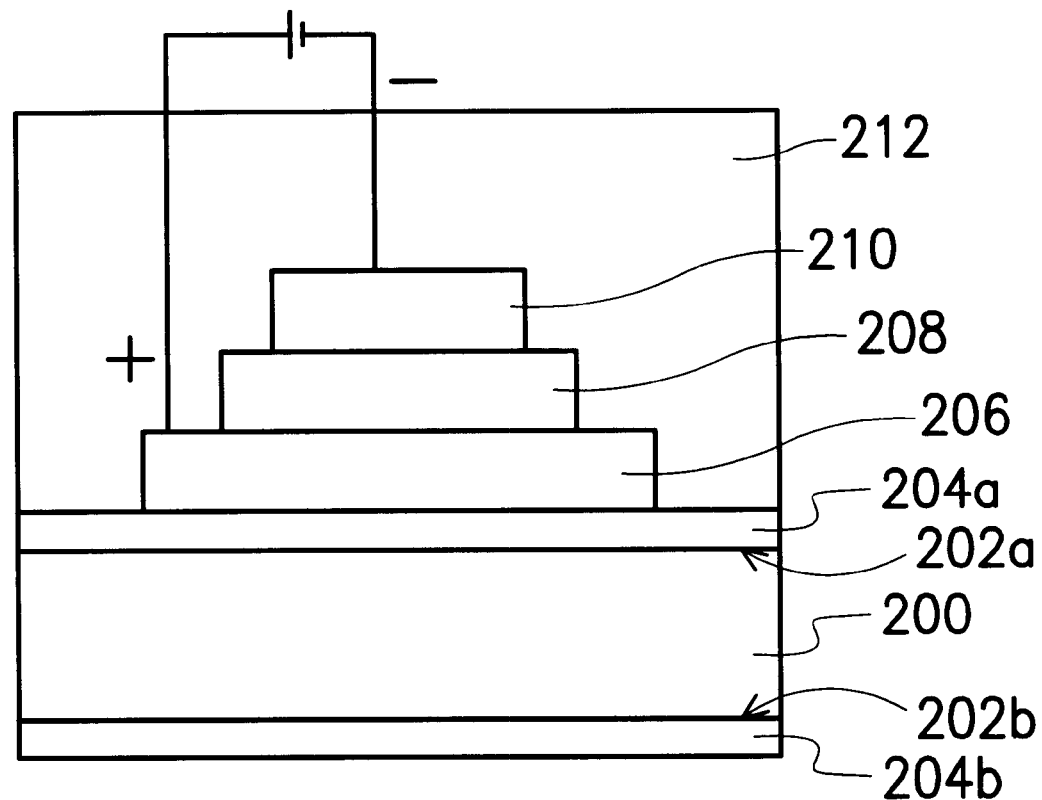

Referring to FIG. 2F, after the metal conductive electrode 210 is formed, a protecting layer 212 is formed on the metal conductive electrode 210, where the plastic substrate 200 currently has the first composite layer 204a, the transparent conductive electrode 206, the emitting layer 208, and the metal conductive electrode 210. The organic luminescent material and the metal electrode are also enclosed by the protecting layer 212, so as to prevent the water and oxygen from reacting with the metal electrode or the organic emitting layer. The life time of the product is thereby effectively prolonged. The method of forming the protecting layer 212 includes ion-assisted electron gun evaporation. It is preferable to put the transparent plastic substrate 200 into the vacuum chamber (not shown in drawings) under the condition that the substrate temperature is less than 100° C. and no oxygen gas is added. The protecting layer 212 is evaporated by ion-assisted electron gun evaporation. The protecting layer 212 includes silicon dioxide ($SiO_2$) having a thickness of about 20 nm to about 150 nm.

The ion-assisted electron gun evaporation of a pure silicon dioxide protecting layer is carried out under the condition that the substrate temperature of less than 100° C. and no oxygen gas is added. The evaporation rate of the silicon dioxide is kept at about 2 nm/s. The gas used for reaction is argon with high purity (more than 99.99%) whose flow rate is 18 ml/min. The other ion-assisted evaporating conditions thereof are the same with that for the titanium dioxide-silicon dioxide composite layer.

In the flexible plastic organic eletro-luminescent device according to the present invention, the first and the second composite layer (204a, 204b), the transparent conductive electrode 206, and the protecting layer 212 all can be evaporated without heating by the ion-assisted electron gun evaporation. Since the striking of the ions will not result in the significant increase in the temperature of the substrate, the temperature during the process mainly comes from evaporation source. From the results of the experiment, in the evaporation process of the present invention, the resultant temperature increased by less than 60° C., which does not adversely affect the plastic substrate, such as PC or PMMA. The process according to the present invention can also be suitable for other plastic substrates sensible to temperature, such as polyethylene terephthalate.

The titanium dioxide-silicon dioxide composite layer obtained by low-temperature ion-assisted electron gun evaporation shows an amorphous structure from the analysis obtained by X-ray diffraction and transmission electron microscope. Since the composite layer will not result in the effect of such as grain boundary scattering, the luminescent efficiency of the organic electro-luminescent device will not be reduced.

Further, the titanium dioxide-silicon dioxide composite layer has very high hardness, 2500 $N/mm^2$ in average. When the content of the titanium dioxide in the titanium dioxide-silicon dioxide composite layer is up to 75%, the hardness thereof is even higher than 4000 $N/mm^2$, which is greater than the hardness of glass. The plastic substrates such as PC and PMMA have hardness in the range from only tens to hundreds $N/mm^2$. Therefore, the plastic substrate can be protected effectively by the titanium dioxide-silicon dioxide composite layer as a hard protecting layer for the plastic substrate and the metal conductive electrode. It can also prevent the organic luminescent device from being damaged caused by external force.

Further, the refraction index of the titanium dioxide-silicon dioxide composite layer can be changed by adjusting the ratio of the composition. For incident light having a wavelength of 550 nm, the refractive index of the composite layer is in the range from 1.46 for pure silicon dioxide to 2.36 for pure titanium dioxide. Therefore, the combination of the titanium dioxide-silicon dioxide composite layer having appropriate composition and thickness and the indium tin oxide layer having an appropriate optical thickness can result in a significant increase in the luminescent efficiency of the organic electro-luminescent device. It can be thus used as a transmittance enhanced layer.

As characteristics of the titanium dioxide-silicon dioxide composite layer, the water and oxygen are prevented from entering into the plastic substrate from the atmosphere or are prevented from being released from the inside of the plastic substrate. See Table 1 and 2, the data shown are the changes in weight of the evaporated composite layer of PC and PMMA plastic substrates, with 200 nm in thickness, before and after the test which is carried out at a relative humidity of 95% and a constant temperature of 25° C. for 6 hours, in which the samples are weighed using a micro scales. In these Tables, the results are also compared with that of blank plastic substrate having no protecting layer.

Table 1 The weight change of PC plastic substrate, coated or without coated a composite film with a thickness of 200 nm before and after the humidity test. The test is carried out at a relative humidity of 95% and a constant temperature of 25° C. for 6 hours.

| Composition (at. %) | X | $TiO_2$ 100% | $TiO_2$ 75% | $TiO_2$ 50% | $TiO_2$ 25% | $SiO_2$ 100% |
|---|---|---|---|---|---|---|
| Weight change (mg) | 0.33 | 0.16 | 0.19 | 0.12 | 0.16 | 0.21 |

Table 2 The weight change of PMMA plastic substrate, coated or without coated a composite film with a thickness of 200 nm before and after the humidity test. The test is carried out at a relative humidity of 95% and a constant temperature of 25° C. for 6 hours.

| Composition (at. %) | X | $TiO_2$ 100% | $TiO_2$ 75% |
|---|---|---|---|
| Weight change (mg) | 2.32 | 1.76 | 1.47 |

As shown in Tables 1 and 2, the prevention of water absorption of the PC and PMMA plastic substrates with an evaporated composite layer of 200 nm in thickness is improved, as shown in a comparison with the blank plastic substrate having no evaporated layer thereon. Therefore, the water and oxygen can be effectively isolated by the titanium dioxide-silicon dioxide composite layer according to the present invention.

Figure 3:
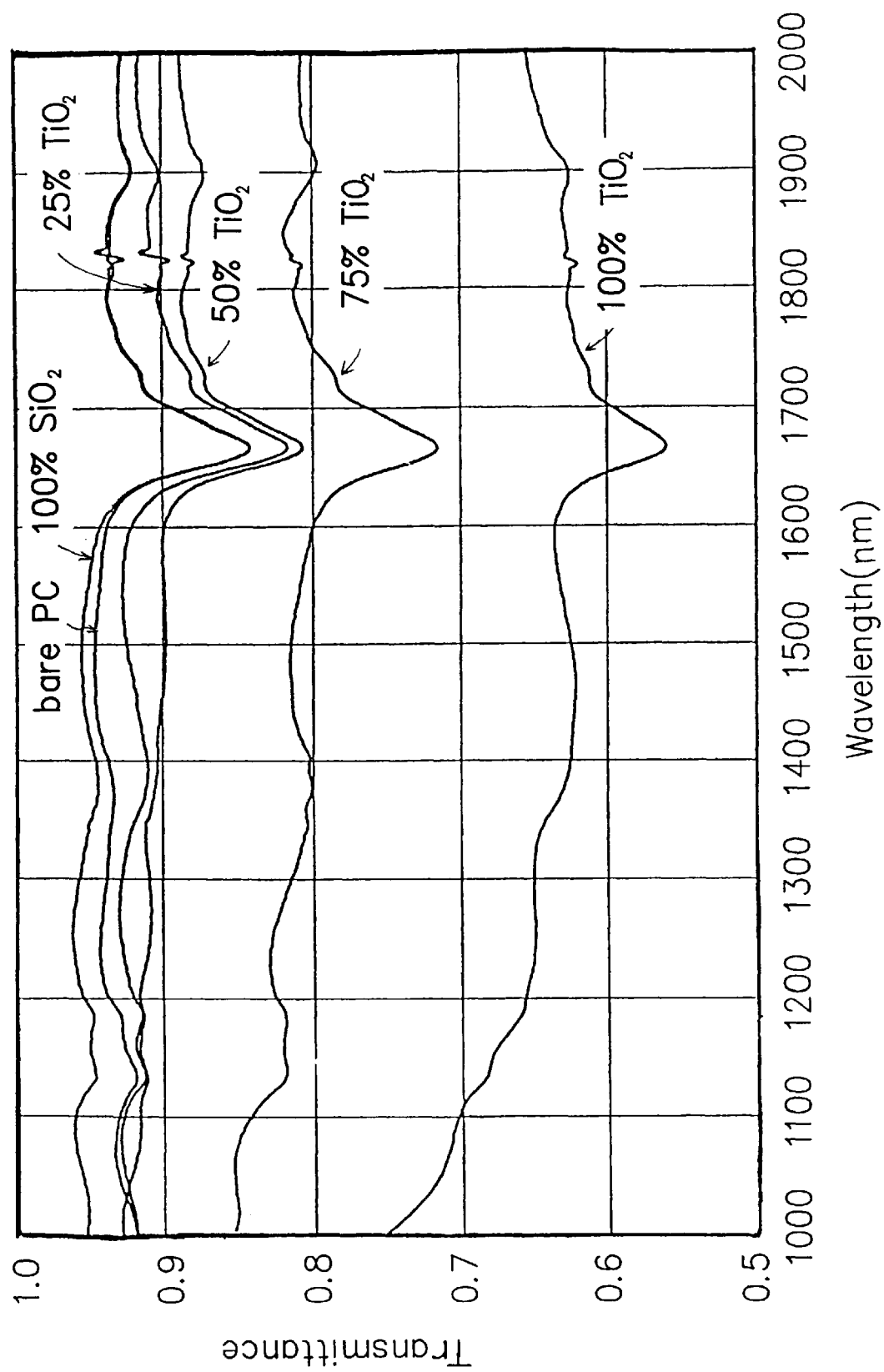
FIG. 3 is the experimental result of the near IR transmittance spectra for the polycarbonate plastic substrate with and without titanium dioxide-silicon dioxide composite layer as a function of $TiO_2$ content, which is obtained at relative humidity of 95% and room temperature for 4 hrs.

Referring to FIG. 3, curves of the transmittance versus the wavelength of incident light according to the PC sample in Table 1 are shown. The vertical axis in the FIG. 3 represents transmittance measured by spectrophotometer, and the horizontal axis represents the wavelength of the incident light in the range from 1000 nm to 2000 nm. The samples tested includes a PC plastic substrate having a titanium dioxide-silicon dioxide composite layer of 200 nm in thickness, and a bare substrate, as shown by the second highest curve, having no composite layer. These samples are placed at a relative humidity of 95% and a constant temperature of 25° C. for 4 hrs. According to the results of measurement, the transmittance varies as the composition of the titanium dioxide-silicon dioxide composite layer changes. The highest curve is the condition of containing silicon dioxide only. When titanium dioxide is included by, for example, 25%, 50% or 75%, the transmittance further decreases.

As shown in FIG. 3, the absorption peak at about 1900 nm is formed due to the O—H asymmetric stretching mode and bending mode, thereby determining the water content in the samples. Further, the optical refractive index is varied as the ratio of the components of the titanium dioxide-silicon dioxide in the composite layer is changed. As mentioned above, the luminescent efficiency of the organic electro-luminescent device can be further increased by selecting appropriate materials and the thickness for layers.

The titanium dioxide-silicon dioxide composite layer according to the present invention is formed mainly by low-temperature ion-assisted electron gun evaporation as the topcoat and undercoat of the transparent plastic conductive substrate for the flexible small molecule organic electro-luminescent device and polymer organic luminescent device. In the present invention, the silicon dioxide layer is formed under the condition that oxygen is not charged by low-temperature ion-assisted electron gun evaporation, as the protecting layer of the metal conductive electrode (electron injection layer) for the small molecule organic electro-luminescent device and polymer organic electro-luminescent device.

The titanium dioxide-silicon dioxide composite layer has superior insulating property, considerable hardness, and smooth surfaces. Therefore, the present invention has the following advantages when the titanium dioxide-silicon dioxide composite layer is evaporated on the upper and lower surfaces of the transparent plastic substrate:

(1) It is a water and oxygen barrier layer for the plastic substrate, resulting in that
  (a) it can prevent the water and oxygen from being released from the plastic substrate to result in poor adhesion to indium tin oxide layer;
  (b) it can prevent water and oxygen from reacting with the metal conductive electrode and/or organic emitting layer to shorten the lifetime of the device.
(2) It is a hard layer for the plastic substrate to protect plastic substrate and metal conductive electrode from being scraped by external force.
(3) It is a bonding layer between the plastic substrate and indium tin oxide layer to prevent cracks of the layers caused by the difference in thermal expansion between indium tin oxide layer and the plastic substrate or by bending.
(4) It is a transmittance enhanced layer for the emitting layer, in which the titanium dioxide-silicon dioxide composite layer and the indium tin oxide layer are combined with appropriate optical thickness to increase the luminescent efficiency of the organic electro-luminescent device.

From the preferable examples of the present invention, the application according to the present invention has the advantages as following:

(1) During the vacuum deposition process, water and oxygen can be effectively prevented from being released from the substrate, so as to increase the adhesion of the indium tin oxide to the plastic substrate. The reaction of the water and oxygen with the organic emitting layer and metal electrode subsequently formed can be avoided to increase the effect and lifetime of the device.
(2) The water and oxygen outside can be effectively prevented from entering the inside of the device through the plastic substrate, which can avoid the instant reaction of the emitting layer in the organic electro-luminescent device and the metal electrode.
(3) The plastic substrate and the metal conductive electrode can be effectively protected to increase the surface hardness of the device from being scraped.
(4) The titanium dioxide-silicon dioxide composite layer and the indium tin oxide layer are combined with appropriate optical thickness to increase the luminescent efficiency of the organic electro-luminescent device.

It will be apparent to those skilled in the art that various modifications and variations can be made to the structure of the present invention without departing from the scope or spirit of the invention. In view of the forgoing, it is intended that the present invention covers modification and variation of this invention provided they fall within the scope of the following claims and their equivalents.

What is claimed is:

1. An organic electro-luminescent device, comprising:
   a plastic substrate having a first surface and a second surface;
   a first composite layer located on the first surface;
   a second composite layer located on the second surface;
   a transparent conductive electrode located on the first composite layer which is located between the plastic substrate and the transparent conductive electrode;
   an organic emitting layer formed on the transparent conductive electrode which is located between the first composite layer and the organic emitting layer;
   a metal electrode formed on the organic emitting layer, wherein the organic emitting layer is between the transparent conductive electrode and the metal electrode; and
   a protecting layer formed on the metal electrode to enclose the metal electrode and the organic emitting layer.

2. The organic electro-luminescent device according to claim 1, wherein the plastic substrate comprises one selected from the group consisting of polycarbonate (PC), polymethyl mathacrylate (PMMA), polyester resin (PET), and epoxy resin (Epoxy).

3. The organic electro-luminescent device according to claim 1, wherein the plastic substrate has the thickness of less than about 0.25 mm.

4. The organic electro-luminescent device according to claim 1, wherein the first composite layer comprises a titanium dioxide-silicon dioxide composite layer.

5. The organic electro-luminescent device according to claim 4, wherein the content of the titanium dioxide in the first composite layer is in the range of from 0% to 100% in atomic percentage.

6. The organic electro-luminescent device according to claim 1, wherein the second composite layer comprises a titanium dioxide-silicon dioxide composite layer.

7. The organic electro-luminescent device according to claim 6, wherein a content of the titanium dioxide in the second composite layer is in the range of from 0% to 100% in atomic percentage.

8. The organic electro-luminescent device according to claim 1, wherein the transparent conductive electrode comprises indium tin oxide.

9. The organic electro-luminescent device according to claim 1, wherein the transparent conductive electrode has a thickness of about 30 nm to about 400 nm.

10. The organic electro-luminescent device according to claim 1, wherein the organic emitting layer comprises at least one layer of organic luminescent material.

11. The organic electro-luminescent device according to claim 1, wherein the organic emitting layer comprises one selected from the group consisting of small molecule organic luminescent material and polymer organic luminescent material.

12. The organic electro-luminescent device according to claim 1, wherein the metal electrode comprises one material selected from the group consisting of lithium, magnesium, calcium, aluminum, silver, indium and the alloy thereof.

13. The organic electro-luminescent device according to claim 1, wherein the protecting layer comprises silicon dioxide.

14. An organic electro-luminescent device, comprising:
- a plastic substrate having a first surface and a second surface;
- a first luminescent efficiency enhanced layer located on the first surface;
- a second luminescent efficiency enhanced layer located on the second surface;
- a transparent conductive electrode located on the first composite layer which is located between the plastic substrate and the transparent conductive electrode;
- an organic emitting layer disposed on the transparent conductive electrode which is located between the first composite layer and the organic emitting layer;
- a metal electrode disposed on the organic emitting layer, wherein the organic emitting layer is between the transparent conductive electrode and the metal electrode; and
- an ion-assisted electron gun evaporated silicon dioxide protecting layer disposed on the metal electrode to enclose the metal electrode and the organic emitting layer.

15. The device of claim 14, wherein the first luminescent efficiency enhanced layer comprises a titanium dioxide-silicon dioxide composite layer.

16. The device of claim 15, wherein a content of the titanium dioxide in the first composite layer is in a range of 0% to 100% in atomic percentage.

17. The device of claim 14, wherein the second luminescent efficiency enhanced layer comprises a titanium dioxide-silicon dioxide composite layer.

18. The device of claim 17, a content of the titanium dioxide in the second composite layer is in a range of 0% to 100% in atomic percentage.

* * * * *